United States Patent [19]

Fujiwara et al.

[11] 3,873,637

[45] Mar. 25, 1975

[54] ADHESIVE COMPOSITION CONTAINING PHENOXY AND EPOXY RESINS AND A CROSS-LINKING AGENT THEREFOR

[75] Inventors: Yoshio Fujiwara; Keiichi Naito; Toru Odajima, all of Utsunomiya, Japan

[73] Assignee: Sony Corporation, Tokyo, Japan

[22] Filed: June 26, 1974

[21] Appl. No.: 483,428

Related U.S. Application Data

[60] Continuation of Ser. No. 334,991, Feb. 23, 1973, abandoned, which is a division of Ser. No. 170,334, Aug. 9, 1971.

[52] U.S. Cl. .................. 260/830 TW, 117/124 E, 117/132 BE, 161/185, 161/186, 260/47 EN, 260/47 EC

[51] Int. Cl. .................. C08q 45/06

[58] Field of Search.... 260/47 EN, 47 EC, 830 TW, 260/78 SC, 2 EN

[56] References Cited

UNITED STATES PATENTS

| | | | |
|---|---|---|---|
| 2,901,443 | 8/1959 | Starck et al. | 260/2 |
| 3,355,437 | 11/1967 | Tsesoro et al. | 260/2 X |
| 3,576,786 | 4/1971 | Kalfayan et al. | 260/47 |

*Primary Examiner*—Melvin Goldstein
*Assistant Examiner*—T. Pertilla
*Attorney, Agent, or Firm*—Lewis H. Eslinger; Alvin Sinderbrand

[57] ABSTRACT

A structural adhesive composition which is particularly suited for bonding or laminating a metal foil to an epoxy resin impregnated glass fiber plate, for example, as in the production of copper clad painted circuit boards, comprises a phenoxy resin having the formula

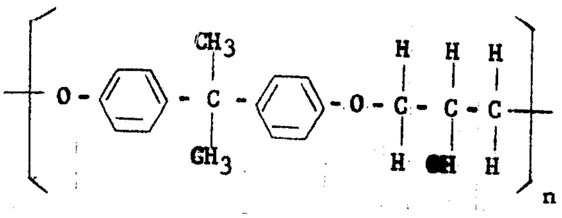

wherein $n$ is 50 to 100, a low molecular epoxy resin having more than two epoxy groups and an epoxy value less than 4,000, and a cross-linking agent which either has at least two aziridine rings at the ends of the moleculaes thereof to react with the hydroxyl group (OH) of said phenoxy resin and with said low molecular epoxy resin for providing a high cross-linking density, or which is a chelate of an organic metal compound having the formula

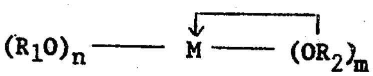

wherein M is a metal atom having a valence of at least one, $n$ is an integer including zero, $m$ is an integer, $R_1$ is a member selected from the group consisting of hydrogen atom, alkyl, unsaturated aliphatic, cyclic alkyl and aryl, and $R_2$ is a member selected from the group consisting of alkyl and aryl which has at least one electron donor atom to form a chelate with said metal atom.

The epoxy resin is preferably present in the composition in an amount between 20 and 400 wt.% based on the amount of the phenoxy resin, and the cross-linking agent is preferably present in the composition in an amount between 2 and 30 wt.% based on the amount of the phenoxy resin.

7 Claims, No Drawings

ADHESIVE COMPOSITION CONTAINING PHENOXY AND EPOXY RESINS AND A CROSS-LINKING AGENT THEREFOR

CROSS-REFERENCES TO RELATED APPLICATIONS

This application is a continuation of our copending U.S. Pat. application Ser. No. 334,991, filed Feb. 23, 1973, and now abandoned which is, in turn, a division of U.S. Pat. application Ser. No. 170,334, filed Aug. 9, 1971.

BACKGROUND OF THE INVENTION

1. Field of the Invention

This invention relates to an adhesive composition that is ideally suited for laminating a metal foil onto an epoxy resin impregnated glass fiber plate.

2. Description of the Prior Art

In the prior art, copper clad printed circuit boards are produced by placing a treated electrolytic copper foil directly on an epoxy glass fiber board of NEMA G-10 grade or MIL GE grade without an adhesive. Where the application does not require a circuit board having the best electrical characteristics and chemical resistance, the copper foil is bonded to the glass board with an adhesive.

Copper clad, epoxy glass boards produced without adhesive have excellent electrical characteristics and chemical resistance but, as compared with boards manufactured with an adhesive, they have defects, such as poor adhesion, low productivity, resulting from difficulties in handling, and brown spots or stains caused by a chemical reaction of the impregnated resin with the treated surface of the copper foil after the latter is etched or by reprint of a copper oxide layer on the board after etching.

Copper clad glass boards with polyvinylacetalphenol system adhesive, polyurethane-epoxy system adhesive, nylonphenol system adhesive or the like are free from the above defects, but have poor chemical resistance and electric charcteristics and hence are restricted in their applications and in the etching or soldering processes that can be employed therewith.

Epoxy resins are known to have excellent chemical resistance, electric characteristics and adhesion to metal when employed as an adhesive. However, when used as an adhesive, epoxy resins have excellent shear strength but poor peel strength. The strength of the bond of the copper foil to the impregnated resin of the printed circuit board is standardized according to its peel strength.

The chemical resistance of the copper clad glass board is its resistance to the chemicals used to etch the copper foil. At present, etching is usually effected with an etchant, such as an aqueous solution of ferric chloride or ammonium persulfate or a sulfuric-chromic acid mixture. The etchant is selected for a particular purpose. In the case of through-hole plating of the copper clad glass board, the board is plated with a metal other than copper and subjected to etching to remove unnecessary portions of the copper foil. In this case, when the glass board is finished with gold plating or tin-nickel plating, a solution of ferric chloride is employed and when the board is finished with solder plating or tin plating a solution of ammonium persulfate or sulfuric-chromic acid mixture is used. The aforementioned adhesives have no resistance, particularly to sulfuric-chromic acid mixture, and they dissolve therein. In the manufacture of multi-layer boards a strong acid, such as fluorhydric acid, is used for a short time to facilitate the through-hold plating and the conventional adhesives are also not resistant to this acid. Various other chemicals are used in the fabrication of printed circuit boards, but no adhesive has previously been proposed which is resistant to the aforementioned and similar chemicals, and which has excellent bond strength, and particularly peel strength.

SUMMARY OF THE INVENTION

An object of the present invention is to provide an adhesive which is comprised of a phenoxy resin, a low molecular epoxy resin having an epoxy value of less than 4,000 and a cross-linking agent having at least two aziridine rings (ethylene imine rings) at the ends of molecules thereof or a cross-linking agent which is chelate of an organic metal compound.

This adhesive is most suitable for laminating a metal foil on an epoxy resin impregnated glass fiber board or a prepreg and has excellent heat and chemical resistance and a strong bond strength. The adhesive of this invention is not limited specifically to use in the manufacture of printed circuit boards, but may be used as a structural adhesive in the manufacture of, for example, airplanes which require excellent bond strength at high temperature. The adhesive may be directly coated and semicured on the surface to be bonded. Althernatively, it is possible to prepare a bonding sheet produced by impregnating and semicuring the adhesive on a glass fiber cloth or by semicuring the adhesive in film form, inserting such bonding sheet between a metal foil and a prepreg, and then heating and pressurizing the overall structure to provide a laminated printed circuit board. The adhesive for the bonding sheet, if heated, will become a liquid, then a gel and finally fully polymerized. This thermally set adhesive or resin cannot be liquefied again by heat. This semicured adhesive or resin is referred to as a B-stage material.

The principal component of the adhesive according to the present invention is a phenoxy resin having the formula:

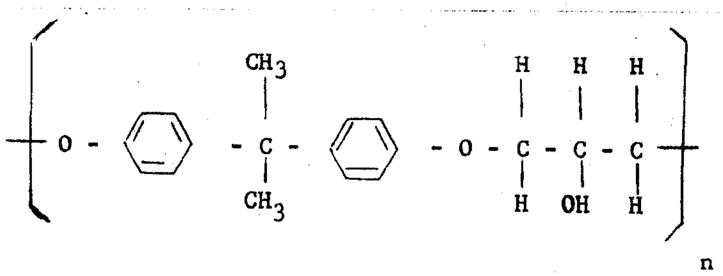

wherein $n$ is about 50 to 100.

The phenoxy resin is generally excellent, as an adhesive, in adhesion, in chemical resistance and in shock resistance. However, since the phenoxy resin is thermoplastic, it has a melting point of about 100°C. and cannot withstand the temperatures of approximately 260°C. used in the soldering step. Further, the adhesive for a printed circuit board must have excellent bond strength, chemical resistance and electric characteristics, as previously described. It has been found that these requirements are well satisfied by adding to the phenoxy resin a cross-linking agent, so that the principal component, that is, the phenoxy resin, forms a cross-linked structure after bonding.

The epoxy value of an epoxy resin impregnated in a glass fiber board of type G-10 or G-11 is usually lower than about 500. The phenoxy resin used in the present invention is a high molecular weight compound in which *n* is about 50 to 100 according to the aforementioned formula, so that even if a metal foil, for example, a copper foil is bonded to an epoxy resin impregnated glass fiber board with the phenoxy resin, the phenoxy resin has poor compatibility with the impregnating epoxy resin because of its poor flow characteristic. In order to compensate for this, the adhesive according to the present invention further includes a low molecular weight epoxy resin which is blended.

The low molecular weight epoxy resin preferably has more than two epoxy groups and an epoxy value of less than 4000 and may be, for example, bisphenol A type epoxy resin, epoxy novolac resin, or other commercially available epoxy resins, such as Unox Epoxide 201 (Trademark), which is 3.4-epoxy-6-methylcyclohexylmethyl-3,4-epoxy-6-methylcyclohexanecarboxylate, available from Union Carbide Corporation. These epoxy resins exhibit excellent flow characteristics when heated up to about 160°C., so that they are suitable for the purpose. The amount of the low molecular weight epoxy resin to be added to the phenoxy resin is preferred to be 20 to 400% by weight with respect to the latter. Reducing the amount of low molecular weight epoxy resin resin to less than 20% with respect to the phenoxy resin causes flow of the adhesive to become poor, and hence prevents complete cross-linking, resulting in lowering of the heat resistance of the adhesive. On the other hand, with more than 400% of the low molecular weight epoxy resin, desired bond strength cannot be obtained.

The phenoxy resin and the low molecular weight epoxy resin are difficult to react directly with each other to provide an adhesive layer of high cross-linking density and, therefore, a cross-linking agent is required.

Typical cross-linking agents are compounds having at least two aziridine rings at the ends of the molecules thereof, such as are represented by the following:

ethylene-urea derivative

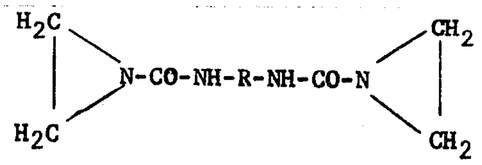

ethylene-urethane derivative

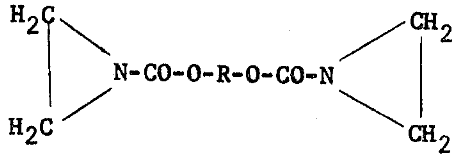

acyl-urethane derivative

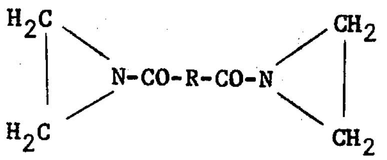

in each of which R is an aliphatic or aromatic group. Atoms such as phosphor and sulfur may be included. Each of these compounds having aziridine rings serves as a hardener of the epoxy resin and, at the same time, reacts with active hydrogen, such as a hydroxyl group (OH) and a carboxyl group (COOH). Accordingly, each compound simultaneously reacts with both the phenoxy resin having the hydroxyl group (OH) and the low molecular epoxy resin to provide an adhesive layer of high cross-linking density. Since the reaction activating temperature of the aziridine rings is higher than room temperature, an adhesive supplemented with the above-mentioned cross-linking agent is highly stable at normal temperature, but it is easy to impart suitable cross-linking density to the adhesive by coating the adhesive on a metal foil such as a copper foil and semicuring the adhesive. When the adhesive coated copper foil is laminated on an epoxy resin impregnated glass fiber board or prepreg, and the semicuring of the adhesive is insufficient, that is, if the degree of cross-linking is too low, the impregnated resin flows into the adhesive layer and reaches the surface of the copper foil with the result that the bond strength between copper foil and adhesive is lowered. When the degree of cross-linking obtained by semicuring the adhesive is too high, migration of the adhesive and the resin of the prepreg is poor and causes incomplete bonding of the copper foil and the prepreg. It is thus desirable to provide suitable cross-linking density by semicuring the adhesive. For the above reasons, the cross-linking agent is preferred to be heat reactive.

The amount of the cross-linking agent having the aziridine rings is preferred to be 2 to 30% by weight relative to the phenoxy resin. An amine resin may be used for adjustment of the curing velocity. The amount of the amine resin is preferred to be 5 to 30% by weight relative to the phenoxy resin. In either case, when the amount of the cross-linking agent which is added is less than the above range of values, the adhesive has insufficient cross-linking density and is poor in chemical and heat resistance. When the amount to be added exceeds the above range of values, the cross-linking density becomes too high and renders the adhesive brittle, thereby lowering its bond strength.

The cross-linking agent included in the adhesive according to the present invention may also be an organic metal compound having a chelate group. The chelate compound has the following general formula:

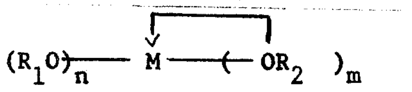

in which M represents a metal atom having a valence of more than one, *n* is an integer including zero, *m* is an integer, $R_1$ is a hydrogen atom, an alkyl group, an unsaturated aliphatic, a hydroxyl group, a ring alkyl group or an aryl group, and $R_2$ is an alkyl or aryl group having more than one electron donor atom, such as, oxygen, nitrogen or sulfur to form a chelate structure. The chelate compounds of the organic metal compound are tetraoctyleneglycol titanate, triethanolaminetitanate diisopropylate, ethylacetoacetate aluminum diisopropylate and methylacetoacetate aluminum dibutoxylate.

The adhesives including the above chelate compounds are highly stable and can be semicured by suitably selecting the conditions for coating and drying of the adhesive.

The chelate compounds having a nitrogen atom as an electron donor atom is particularly effective for reaction with the epoxy group of the low molecular weight epoxy resin. The chelate compounds containing oxygen or sulfur are a little lower in reactivity with the epoxy group, so that a hardener such as boron trifluoride, or an amine adduct of $BF_3$, for example, $C_2H_5NH_2 \cdot BF_3$, or

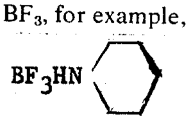

may be used, if necessary. Further, the aforementioned amine resin may also be employed for adjustment of the curing velocity. The amount of the chelate compound employed is preferred to be from 5 to 20% by weight with respect to the phenoxy resin and, where a hardener is mixed in the compound, the amount of the hardener is preferably from 0.1 to 1% by weight relative to the compound.

When supplemented with a ketonic solvent, such as acetone, methylethylketone or the like, whose carbon number is small, the adhesive according to this invention has a lower viscosity. With the addition of such a solvent, a copper clad glass board, which is free from reprint of the copper oxide after etching, can be readily produced by a coating method, such as, by using a knifecoater, which does not apply appreciable shearing force to the treated surface of the copper foil. This is to be compared with laminating the treated copper foil directly on the prepreg without adhesive.

Use of the adhesive according to this invention prevents the appearance of the stain which results from reaction of the copper oxide layer with the impregnated resin. In order to provide this, experiments were conducted in which two adhesive coated copper foils were laminated under the usual conditions for laminating a copper foil on an epoxy resin impregnated glass board, that is, under a pressure of 40 to 60 kg/cm² and at a temperature of 160° to 180°C. for 1 hour. An adhesive coated copper foil was laminated on an epoxy glass of G-10 or G-11 grade to provide a copper clad glass board. In both cases, the copper foil was etched with a solution of ferric chloride of 40 Baume degrees at a temperature of 25° to 30°C. but no stain was found.

The metal clad printed circuit board produced with an adhesive according to this invention had excellent chemical resistance, electric characteristics and adhesion between the metal foil and the glass board. Further, this metal clad glass board was free from reprint of the copper oxide, stain and discoloration.

EXAMPLE 1

| Composition of adhesive | Parts by weight |
|---|---|
| PHENOXY PAHJ (trademark) available commercially from Union Carbide Corporation and which is a phenoxy resin that is the reaction product of Bisphenol A and epichlorohydrin having a molecular weight of about 30,000 and lacking terminal highly reactive epoxy groups. | 100 |
| Epon 828 (trademark) available commercially from Shell Chemicals Company, and which is a low molecular epoxy resin, more specifically, a diglicydyl ether of Bisphenol A based resin. | 70 |
| Cross-linking Agent having the formula: | 10 |

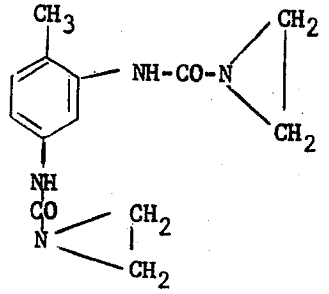

or the formula:

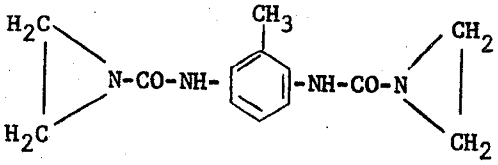

A solution of PHENOXY PAHJ and Epon 828 in methylethylketone is mixed with 20% by weight of a solution of the above cross-linking agent in dimethyl formamide in the above ratio and the solid content of the total solution is adjusted to be 20% by weight with respect to the total amount. The above cross-linking agent is produced by sufficiently stirring a solution of toluene diisocyanate in dehydrated acetone or toluene at 0°C. while dropping ethyleneimine into the solution, in which case the reaction quantitatively proceeds.

The adhesive thus obtained is laid down on a treated electrolytic copper foil T/A (manufactured by Circuit Foil Corporation) and is then treated at normal temperature for two minutes, at 90°C. for 2 minutes and at 160°C. for four minutes to produce an adhesive coated copper foil with the adhesive being 20 microns in thickness (dry thickness).

| Production of prepeg (NEMA G-10 grade) | Parts by weight |
|---|---|
| EPIKOTE 1001 (trademark) available commercially from Shell Chemicals Company, and which is a Bisphenol A epoxy resin having epoxy values in the range of 450 to 500. | 100 |
| dicyano diamine | 4 |
| benzyl dimethyl amine | 0.2 |

Dicyano diamine is dissolved in a solvent containing 50%, by weight, dimethyl formamide and 50%, by weight, ethyl cellosolve, the amount of dicyano diamine being 20%, by weight, with respect to the solvent. EPIKOTE 1001, the dicyano diamine solution and benzyl dimethyl amine are dissolved in acetone to adjust the viscosity to about 200 centipoise (CPS).

The resin solution of the above composition is impregnated in a glass cloth treated with a silane coupling agent and is treated at normal temperature for 2 minutes, at 100°C. for 2 minutes and at 160°C. for 4 minutes successively to impregnate the resin in the glass cloth in order to produce a prepreg having about 40% resin.

Then, the adhesive coated copper foil is placed on several sheets of the prepregs and laminated therewith under a pressure of 10 kg/cm² at 160°C. for 4 minutes and then under a pressure of 40 kg/cm² at 160°C. for 1 hour to provide a copper clad glass board having a thickness of 1.6 mm. The characteristics of the copper clad glass board thus produced are shown in Table 1.

EXAMPLE 2

| | |
|---|---|
| PHENOXY PAHJ | 100 parts by weight |
| DEN 431 (trademark) available commercially from Dow Chemicals Corp., and which is a low molecular epoxy resin, more specifically an epoxy novolac resin having an epoxy value of 172 to 179. | 50 do. |
| Cross-linking agent having the formula: | 7 do. |

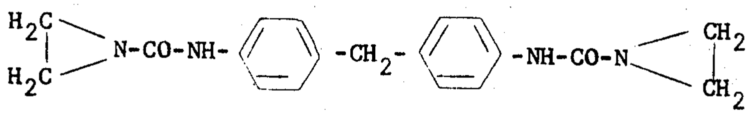

An adhesive similar to that in Example 1 is produced by using the above materials and an adhesive coated, electrolytic copper foil is produced under the same conditions as those in Example 1. The above cross-linking agent is produced by using diphenylmethanediisocyanate as a starting material under conditions similar to those employed in Example 1.

| Production of Prepreg | Parts by weight |
|---|---|
| EPIKOTE 1001 | 100 |
| EPIKOTE 154 (trademark) available commercially from Shell Chemicals Company, and which is an epoxy novolac resin having an epoxy value of 176 to 181. | 100 |
| diaminodiphenylsulfone (hardener) | 30 |
| $BF_3400$ (hardener by Shell Chemicals Corp.) | 1.5 |

The above materials are dissolved in methylethylketone and the viscosity is adjusted to about 200 centipoise (CPS). Epoxy resin impregnated glass cloths are produced using this solution under the same conditions as those in Example 1 to provide a prepreg of NEMA G-11 grade.

The above adhesive coated copper foil is placed on several sheets of the prepregs and laminated with the latter under a pressure of 10 kg/cm² at 160°C. for four minutes and then under a pressure of 70 kg/cm² at 180°C. for one hour, thus producing a copper clad glass board. The characteristics of this board are shown in Table 1.

EXAMPLE 3

| | Parts by weight |
|---|---|
| DER 488 N-40 (trademark) available commercially from Dow Chemicals Corp., and which is a phenoxy resin that is the reaction product of Bisphenol A and epichlorohydrin having a molecular weight of about 30,000 and lacking terminal highly reactive epoxy groups, with approximately 40% solids content. | 400 |

EXAMPLE 3 – Continued

| | Parts by weight |
|---|---|
| DER 511 (trademark) available commercially from Dow Chemicals Corp., and which is a low molecular epoxy resin, more specifically, a brominated Bisphenol A epoxy resin with an epoxy value of 445 to 520 and a bromine content of 18 to 20 weight percent. | 50 |
| Cross-linking agent having the formula: | 10 |

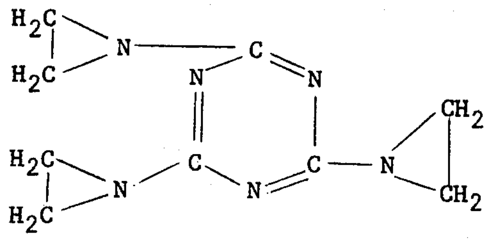

The cross-linking agent is dissolved in dimethyl formamide and the resulting solution is mixed with a solution of the above resin in methylethylketone to produce an adhesive having a solids content of 20% with respect to the total amount of the mixture. An adhesive coated copper foil is produced using the adhesive under the same conditions employed in Example 1.

The preparation of the above cross-linking agent is achieved in the following manner. Cyanuryl chloride is dissolved in dioxane and suspended in ice water and the suspension is held at 0° to 2°C. An aqueous solution of ehtyleneimine and calcium carbonate is dropped into the suspension for an hour while stirring, after which the solution is further stirred at 1°C. for 20 minutes to terminate the reaction. The reactant is decolored with an active carbon powder and filtered and the filtrate is extracted with chloroform to obtain the desired substance.

| Production of prepreg | Parts by weight |
|---|---|
| DER 511 | 100 |
| DER 611 (trademark) available commercially from Dow Chemicals Corp., and which is a Bisphenol A epoxy resin having an epoxy value of 475 to 565. | 50 |
| dicyano diamine | 4 |
| benzyl dimethyl amine | 0.3 |

Dicyano diamine is dissolved in a solution containing 50%, by weight, dimethyl formamide and 50%, by weight, ethyl cellosolve, and all of the above components are dissolved in acetone and the viscosity is adjusted to approximately 200 centipoise (CPS). Epoxy resin impregnated glass cloths are produced with the above solution under similar conditions to those in Example 1 to provide a prepreg of NEMA FR-4 grade.

Then, the adhesive coated copper foil is placed on several sheets of the prepregs and laminated therewith under a pressure of 10 kg/cm² at 175°C. for 2 minutes and then under a pressure of 35 kg/cm² at 175°C. for an hour to produce a copper clad glass board. The characteristics of the board thus produced are shown in Table 1.

EXAMPLE 4

| | Parts by weight |
|---|---|
| Araldite 684 EK-40 (trademark) available commercially from Ciba, and which is phenox resin that is the reaction product of Bisphenol A and epichlorohydrin having a molecular weight of about 30,000 and lacking terminal highly reactive epoxy groups, with approximately 40% solids content. | 400 |
| DER 580 (trademark) available commercially from Dow Chemicals Corp., and which is a low molecular epoxy resin, more specifically, a brominated Bisphenol A epoxy resin with an epoxy value of 214 to 221 and a bromine content of 16 to 18 weight percent. | 40 |
| APO (cross-linking agent by Sogo Yakuko) having the formula below: | 5 |

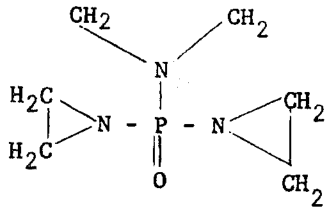

| | |
|---|---|
| Beckamine J820 (amine resin by Dai Nippon Ink & Chemicals Inc.) | 5 parts by weight |

The above components are employed in the same way as in Example 1 to produce an adhesive coated copper foil.

| Production of prepreg | Parts by weight |
|---|---|
| EPIKOTE 1045-A-70 (trademark) available commercially from Shell Chemicals Corp., and which is a brominated Bisphenol A epoxy resin with an epoxy value of 450 to 500 and a bromine content of 18 to 20 weight percent. | 75 |
| EPIKOTE 154 | 25 |
| diaminodiphenylsulfone | 15 |
| $BF_3$ 400 (hardener by Shell Chemicals Corp.) | 0.8 |

A prepreg of NEMA FR-5 grade is produced in the same manner as in Example 1, except that an epoxy resin solution of the above components in 90 parts by weight of methylethylketone is treated at normal temperature for two minutes, at 90°C. for 2 minutes and at 130°C. for 5 minutes.

The aforementioned adhesive coated copper foil is laminated on several sheets of the prepregs under a pressure of 10 kg/cm$^2$ at 160°C. for 4 minutes, and then under a pressure of 40 kg/cm$^2$ at 180°C. for an hour to produce a copper clad glass board. The characteristics of the board thus obtained are shown in Table 1.

EXAMPLE 5

| | | |
|---|---|---|
| PHENOXY PAHJ | 100 | parts by weight |
| Epon 828 | 50 | do. |
| Tyzor TE (chelate compound by Du Pont) | 5 | do. |

A copper clad glass board is made in the same manner as in Example 1, except that the above components are dissolved in methylethylketone to produce an adhesive having a solid content of 20%. The characteristics of the glass board thus obtained are shown in Table 2.

EXAMPLE 6

| | | |
|---|---|---|
| PHENOXY PAHJ | 100 | parts by weight |
| Epon 828 | 50 | do. |
| Tyzor AA (chelate compound by Du Pont) | 5 | do. |
| $BF_3.NH_2C_2H_5$ | 0.3 | do. |

A copper clad glass board is produced in the same manner as in Example 1 except that the above components are dissolved in methylethylketone to provide an adhesive having a solids content of 20%. The characteristics of the glass board thus obtained are shown in Table 2.

EXAMPLE 7

| | | |
|---|---|---|
| PHENOXY PAHJ | 100 | parts by weight |
| Epon 828 | 50 | do. |
| methylacetate aluminum butoxylate | 5 | do. |
| $BF_3.NH_2C_2H_5$ | 0.3 | do. |
| Beckamine J820 (amine resin by Dai Nippon Ink & Chemicals Inc.) | 5 | do. |

A copper clad glass board is produced in the same manner as in Example 1 except that an adhesive is made from the above components. The characteristics of the glass board are shown in Table 2.

EXAMPLE 8

| | Parts by weight |
|---|---|
| EPIKOTE OL-55-B-40 (trademark) available commercially from Shell Chemicals Corp., and which is a phenoxy resin that is the reaction product of Bisphenol A and epichlorohydrin having a molecular weight of about 30,000 and lacking terminal highly reactive epoxy groups, with a solids content of about 40%. | 400 |
| Epon 828 | 40 |
| Cross-linking agent having the formula: | 10 |

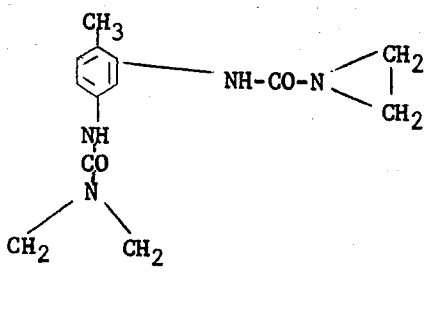

| | |
|---|---|
| Beckamine J820 (amine resin by Dai Nippon Ink & Chemicals Inc.) | 5 parts by weight |

The above components are dissolved in methylethylketone to obtain an adhesive having a solids content of 20% by weight in respect to the methylethylketone. This adhesive is coated 25 microns thick on a polypropylene laminated paper and held at normal temperature for 2 minutes, at 90°C. for 2 minutes and then at 140°C. for 4 minutes. The coated adhesive is peeled off from the laminated paper and pressed between a copper foil and a prepreg under the same conditions employed in Example 1, thus obtaining a copper clad glass board. The characteristics of the board are shown in Table 1.

Table 1

| Copper clad glass board | Peel Strength (kg/cm) Normal condition | After soaking in solder at 260°C for 3 minutes | After soaking in 10% KCN solution at 70°C for 30 minutes | After heating at 140°C for 7 days | After treated with boiled trichloroethylene for one hour | Surface insulation resistance (M Ω) | Treatment with sulfuric-chromic acid mixture |
|---|---|---|---|---|---|---|---|
| Example 1 Adhesive not used | 1.66 | 1.55 | 1.60 | 1.65 | 1.54 | Higher than $10^5$ | Insoluble |
| Conventional Sample A Adhesive not used | 1.75 | 1.59 | 1.55 | 1.48 | 1.73 | '' | '' |
| Conventional Sample B Adhesive not used | 1.58 | 1.54 | 1.28 | 1.50 | 1.55 | '' | '' |
| Butyrol phenol system adhesive used | 2.15 | 1.90 | 1.76 | 1.80 | 1.89 | '' | Soluble |
| Example 1 | 2.38 | 2.17 | 2.20 | 2.25 | 2.17 | '' | Insoluble |
| Example 2 | 2.06 | 2.02 | 2.01 | 2.02 | 2.17 | '' | '' |
| Example 3 | 2.31 | 2.05 | 2.02 | 2.10 | 2.32 | '' | '' |
| Example 4 | 2.50 | 2.20 | 2.00 | 2.15 | 2.57 | '' | '' |
| Example 8 | 2.42 | 2.20 | 2.30 | 2.30 | 2.42 | '' | '' |

The surface insulation resistances were measured under the condition JIS C-96/35/90. In the treatment with a sulfuricchromic acid mixture, the copper clad glass boards were treated with a solution of 400 g/l of $CrO_3$ in 70 g/l of concentrated sulfuric acid at 50°C. for 15 minutes. The other tests were conducted with reference to the standards therefor such as MIL, NEMA and JIS.

Table 2

| Copper clad glass board | Peel Strength (kg/cm) Normal condition | After soaking in solder at 260°C for 3 minutes | After soaking in 10% KCL solution at 70°C for 30 minutes | After heating at 140°C for 7 days | After being treated with boiled trichloroethylene | Surface insulation resistance (MΩ) | Treatment with sulfuric-chromic acid mixture |
|---|---|---|---|---|---|---|---|
| Example 5 | 2.17 | 1.90 | 1.90 | 2.05 | 2.10 | Higher than $10^5$ | Insoluble |
| Example 6 | 2.36 | 1.95 | 1.84 | 2.34 | 2.30 | '' | '' |
| Example 7 | 2.26 | 1.85 | 2.00 | 2.22 | 2.22 | '' | '' |

EXAMPLE 9

| Composition of adhesive | Parts by weight |
|---|---|
| PHENOXY PAHJ | 100 |
| EPON 828 | 70 |
| Cross-linking agent having the formula: | 10 |

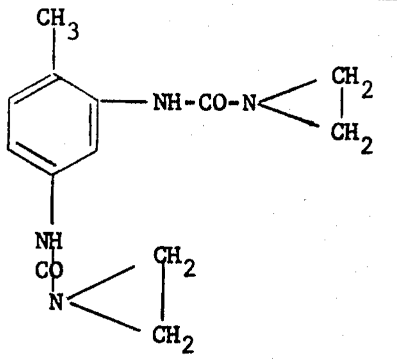

The adhesive is produced in the same way as in Example 1. An aluminum foil of JIS A1P1- 1/2 H grade, 50 microns in thickness and an aluminum plate of JIS A1P1 grade, 2 mm in thickness, were soaked in sulfuric-chromic acid mixture containing $CrO_3$, $H_2SO_4$ and $H_2O$ in the ratio of 1:5:15 by weight and heated up to 70°C. to oxidize the surface of the aluminum plate. Two aluminum plates thus treated were coated with the above adhesive and held at room temperature for 2 minutes, thereafter being heated at 90°C. for 2 minutes and then at 140°C. for 4 minutes to semicure the adhesive. The semicured adhesive layer was 25 microns thick. These two aluminum plates were placed one on the other and pressed together under a pressure of 10 kg/cm² at 160°C. for 30 minutes to provide a sample 1 for measuring shear strength.

Then, an aluminum plate and an aluminum foil were coated with the adhesive in the same manner as that above described and then similarly bonded together to obtain a sample 2 for measuring peel strength.

For comparing the adhesive according to the invention as in this Example 9, with a conventional epoxy resin adhesive, two aluminum plates were bonded together by an epoxy resin adhesive, "Bond master" M666 (trademark) available commercially from Pittsburg-Midland (Adhesives) Ltd., England, and also from Sony Chemicals Corp., and which is a well known Bisphenol A epoxy resin: polyamide resin adhesive. The bonding together of the aluminum plates with such conventional epoxy resin adhesive was effected at 121°C for 30 minutes to obtain a sample 3 with the adhesive layer being 50 microns thick for measuring shear strength, and an aluminum foil was similarly bonded to an aluminum plate under similar conditions to obtain a sample 4 for measuring peel strength.

The measured values of the samples are given in the following table.

| | Shear strength (kg/cm²) | | | | Peel strength (kg/cm) | | | |
|---|---|---|---|---|---|---|---|---|
| | −30°C | 25°C | 60°C | 100°C | −30°C | 25°C | 60°C | 100°C |
| Adhesive of this invention (Example 9) | 293 | 255 | 251 | 171 | 2.16 | 2.10 | 2.16 | 1.85 |
| Conventional Adhesive (Bond master M666) | 287 | 253 | 35 | 12.0 | 1.4 | 1.36 | 1.07 | 0.72 |

As is apparent from the above data, the adhesive according to this invention is very superior in peel strength compared to the conventional adhesive, and also has excellent shear strength at high temperature. The adhesive according to the invention withstands use even at 100°C. The adhesive of the present invention is most suitable as a suitable as a structural adhesive which can be used at high temperature. Similar samples were tested for their resistance to chemicals such as chromic acid, ammonium persulfate, potassium cyanide, trichloroethylene and so on and water resistance but the bond strength did not decrease. The conventional epoxy adhesive had no resistance to trichloroethylene.

It will be apparent that many modifications and variations may be effected without departing from the scope of the novel concepts of this invention.

What is claimed is:

1. A structural adhesive composition comprising: a phenoxy resin having the formula

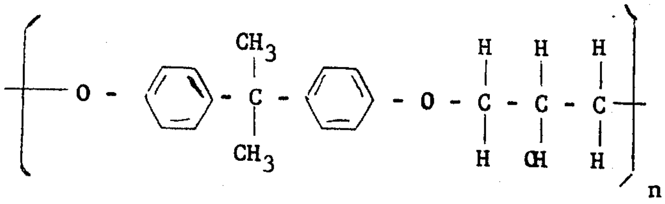

wherein $n$ is 50 to 100, a low molecular epoxy resin having more than two epoxy groups and an epoxy value less than 4,000, and cross-linking cross- agent having at least two aziridine rings at the ends of the molecules thereof to react with the hydroxyl group (OH) of said phenoxy resin and with said low molecular epoxy resin for providing a high cross-linking density, said epoxy resin being present in the composition in an amount between 20 and 400 wt.% based on the amount of said phenoxy resin, and said cross-linking agent being present in the composition in an amount between 2 and 30 wt.% based on the amount of said phenoxy resin.

2. A structural adhesive composition according to claim 1; in which said cross-linking agent is selected from the group consisting of the formulas

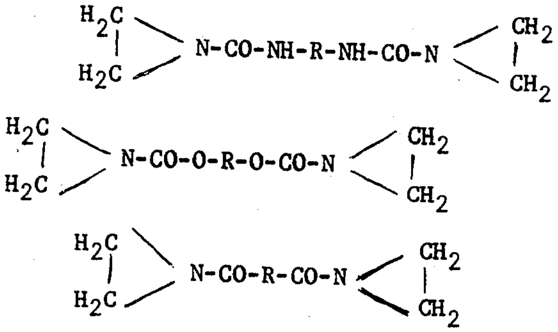

in which R is an aliphatic or aromatic group.

3. A structural adhesive composition according to claim 1; wherein said cross-linking agent has the following formula:

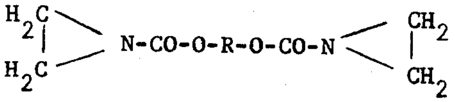

4. A structural adhesive composition according to claim 3; wherein R is aliphatic.

5. A structural adhesive composition according to claim 3; wherein R is aromatic.

6. A structural adhesive composition according to claim 5; wherein said cross-linking agent has the following formula:

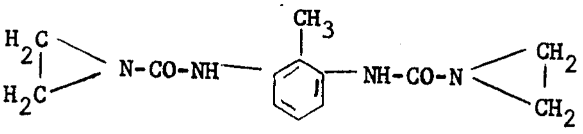

7. A structural adhesive composition according to claim 5; wherein said cross-linking agent (1) has the following formula:

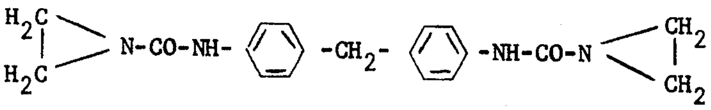

* * * * *